(12) United States Patent
Marques (10) Patent No.: US 7,741,696 B2
(45) Date of Patent: Jun. 22, 2010

(54) SEMICONDUCTOR INTEGRATED CIRCUIT INCLUDING METAL MESH STRUCTURE

(75) Inventor: Augusto M. Marques, Austin, TX (US)

(73) Assignee: ST-Ericsson SA, Geneva (CH)

( * ) Notice: Subject to any disclaimer, the term of this patent is extended or adjusted under 35 U.S.C. 154(b) by 382 days.

(21) Appl. No.: 11/014,143

(22) Filed: Dec. 16, 2004

(65) Prior Publication Data

US 2005/0253223 A1 Nov. 17, 2005

Related U.S. Application Data

(60) Provisional application No. 60/570,602, filed on May 13, 2004.

(51) Int. Cl.
*H01L 23/48* (2006.01)
*H01L 23/52* (2006.01)
*H01L 23/552* (2006.01)

(52) U.S. Cl. ........................ 257/508; 257/659; 257/758; 257/E23.151; 257/E23.175; 257/E21.575; 438/622

(58) Field of Classification Search ................. 257/659, 257/508, 660, E23.151, E23.175, E21.575; 438/622
See application file for complete search history.

(56) References Cited

U.S. PATENT DOCUMENTS

| 5,151,769 | A | * | 9/1992 | Immorlica et al. .......... 257/659 |
| 5,446,243 | A | * | 8/1995 | Crowder et al. ............. 174/250 |
| 5,925,921 | A | | 7/1999 | Susak |
| 6,020,614 | A | | 2/2000 | Worley |
| 6,066,537 | A | | 5/2000 | Poh |
| 6,111,742 | A | | 8/2000 | Bonhoure et al. |
| 6,232,668 | B1 | * | 5/2001 | Hikita et al. ................. 257/777 |
| 6,255,600 | B1 | * | 7/2001 | Schaper ..................... 174/255 |
| 6,278,148 | B1 | | 8/2001 | Watanabe et al. |
| 6,897,509 | B2 | | 5/2005 | Yamauchi et al. |
| 7,013,436 | B1 | * | 3/2006 | Morton et al. ................. 716/1 |

(Continued)

FOREIGN PATENT DOCUMENTS

JP        2209735 A        8/1990

(Continued)

OTHER PUBLICATIONS

Notification of Transmittal of the International Search Report and the Written Opinion of the International Searching Authority, International application No. PCT/US2005/016549, May 13, 2005.

(Continued)

*Primary Examiner*—Lex Malsawma
(74) *Attorney, Agent, or Firm*—William J. Kubida; Scott J. Hawranek; Hogan Lovells US LLP (57) ABSTRACT

A metal mesh structure for use in an integrated circuit is described. In one embodiment, a semiconductor integrated circuit includes a first region including, for example, a device layer having one or more active semiconductor devices. The circuit also includes a second region, which may include a metalization layer including circuit wires. The circuit further includes a layer of metal mesh interposed between the first and second regions, and which may be implemented on at least a portion of another metalization layer.

32 Claims, 7 Drawing Sheets

U.S. PATENT DOCUMENTS

| | | | |
|---|---|---|---|
| 7,285,843 B2* | 10/2007 | Arakawa et al. | 257/659 |
| 7,430,800 B2* | 10/2008 | Haridass et al. | 29/846 |
| 7,449,371 B2* | 11/2008 | Kemerling et al. | 438/128 |
| 2001/0020713 A1 | 9/2001 | Yoshitomi et al. | |
| 2003/0015772 A1* | 1/2003 | Ivanov et al. | 257/659 |
| 2003/0052352 A1 | 3/2003 | Soeda | |
| 2003/0205746 A1 | 11/2003 | Yamauchi et al. | |
| 2005/0101116 A1* | 5/2005 | Tseng | 438/622 |

FOREIGN PATENT DOCUMENTS

| | | |
|---|---|---|
| JP | 4142065 A | 5/1992 |

OTHER PUBLICATIONS

International Search Report, International application No. PCT/US2005/016549, May 13, 2005.

Written Opinion of the International Searching Authority, International application No. PCT/US2005/016549, May 13, 2005.

A Faraday Cage Isolation Structure for Substrate Crosstalk Suppression; Joyce H. Wu, Jörg Scholvin, Jesus A. del Alamo, and Keith Jenkins; IEEE Microwave and Wireless Components Letters; vol. 11; Oct. 10, 2001.

Multilevel Approach for the Investigation of Substrate Parasitics in Mixed-Signal IC's from Full-wave Analysis; MO3D-6; S. Wane, D. Bajon, H. Baudrand, and P. Gamand; 2003 IEEE Radio Frequency Integrated Circuits Symposium; 0-7803-7694-3/03/$17.00.

Written Opinion of the International Searching Authority, International Application No. PCT/US2005/016549, mailed Nov. 23, 2006.

* cited by examiner

SEMICONDUCTOR INTEGRATED CIRCUIT INCLUDING METAL MESH STRUCTURE

This application claims priority to U.S. provisional patent application Ser. No. 60/570,602, filed May 13, 2004, entitled "Semiconductor Integrated Circuit Including Metal Mesh Structure."

BACKGROUND OF THE INVENTION

1. Field of the Invention

This invention relates to semiconductor integrated circuits and, more particularly, to shielding structures and metallization layers within semiconductor integrated circuits.

2. Description of the Related Art

Integrated Circuits (ICs) are manufactured using complex processes including a variety of specific processing steps. Typically, the solid-state devices that make up an IC are formed on the surface (or substrate) of a semiconducting material such as silicon, for example. Although silicon has been the most widely used semiconducting material, other materials such as Gallium-Arsenide (GaAs) and Silicon-Germanium (SiGe) have also become popular for certain applications including analog and specialty integrated circuits. Once the devices have been formed, the individual components are interconnected. The devices are typically interconnected by metal lines or wires made from aluminum, copper, tungsten or some other conductive material. The metal lines are typically manufactured by depositing layers of metal over the entire surface of the wafer and then precisely etching away areas other than those defining the metal lines. Due to the high density of devices, most modern ICs include multiple metal layers that may be separated by an interlayer dielectric (ILD).

Analog circuits and especially high frequency analog circuits can be susceptible to noise. The operation of such circuits may be affected adversely when placed in noisy environments. This may be particularly true of analog and mixed signal integrated circuits. Mixed signal ICs may include both analog and digital circuits that are manufactured on the same semiconducting substrate. Noise and spurious signals generated by one circuit may adversely affect the operation of other circuitry. For example, the digital circuits can generate switching noise that may detrimentally affect the operation of analog circuits that are nearby or are otherwise coupled to the digital circuits.

In some IC designs, it may thus be desirable to shield signals from one another from a capacitive coupling point of view. This is often accomplished by introduction of metal lines and/or metal planes between the signal regions. Although this approach works adequately in some IC designs, in designs that require the shielding of numerous important signals, a very high metal density may result from the use of large amounts of metal plane shielding. Unfortunately, many fabrication technologies impose strong restraints on high metal densities to avoid dishing and other manufacturing problems.

In addition, while in many IC designs shielding of signals from an inductive point of view is generally not considered, at gigahertz frequencies and with thick metals, reasonable attenuation of magnetic fields through continuous metal planes may be attained. As stated above, however, continuous metal planes are generally not allowed (or are disfavored) in many fabrication technologies due to manufacturability issues.

It is also sometimes necessary that characteristics of different components in an IC be precisely matched. For example, it may be desirable to precisely match the electrical characteristics (e.g., capacitance values) of different capacitors formed within an IC. Depending on the type of capacitor and the specific manufacturing process, conventional trimming techniques may not be viable or desirable. Another method used to accomplish matching may include the use of a continuous metal plane shield to create a matched environment for the capacitors. However, as stated above, in addition to the manufacturability issues associated with the high metal density of continuous metal plane shields, the possibility of dishing may also hinder the ability to create a matched environment.

Finally, it is also sometimes desirable in IC designs for manufacturability reasons to ensure good planarization and consistent metal uniformity. Typically the goal is to increase the metal density to above 20% but below about 70% or 80% in a uniform way. Fill programs are commonly used to add metal dummy fill structures wherever it is considered necessary. However, in some designs such as analog designs, the dummy metal fill structures are not desirable since they may detrimentally affect performance.

It would accordingly be desirable to provide an integrated circuit structure that may provide suitable capacitive shielding, suitable inductive shielding and/or desired metal uniformity or increased metal density without the manufacturability problems associated with continuous metal planes.

SUMMARY OF THE INVENTION

Various embodiments of a metal mesh structure for use in an integrated circuit are disclosed. In one embodiment, a semiconductor integrated circuit includes a first region, a second region, and a layer of metal mesh interposed between the first and second regions.

In one specific implementation, the first region may include, for example, a device layer having one or more active semiconductor devices. The second region may include a metalization layer including circuit wires. The layer of metal mesh may be implemented on at least a portion of another metalization layer.

In another embodiment, a semiconductor integrated circuit includes a first region, a second region, and a shield situated between the first region and the second region. The shield may be formed by a first metallic layer including a pattern of substantially uniformly spaced openings.

In various embodiments, a metal mesh structure may be utilized within an integrated circuit to provide suitable capacitive shielding, suitable inductive shielding, and/or desired metal uniformity.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

Figure 1:
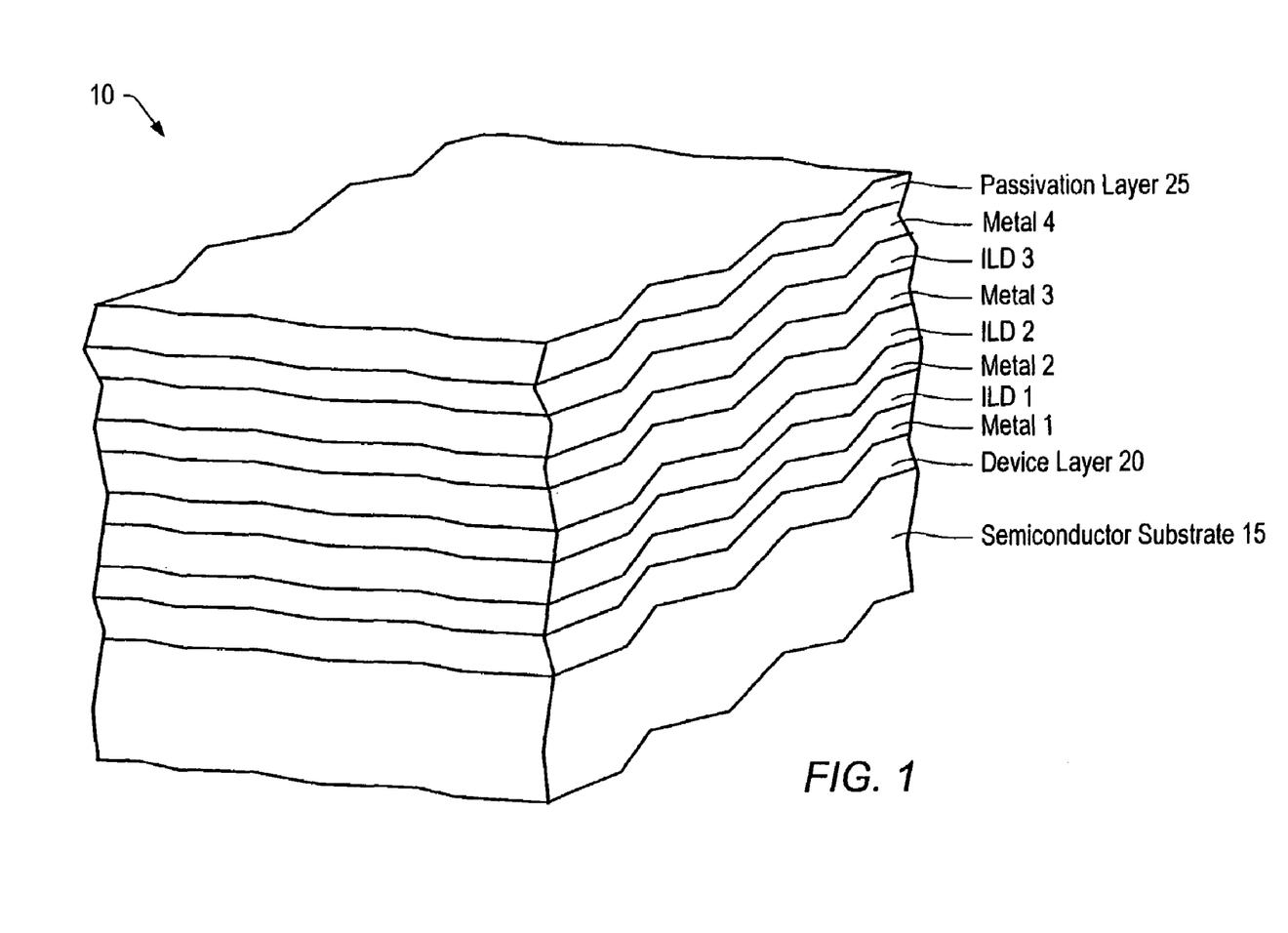
FIG. 1 is a cross sectional perspective view diagram of a portion of an integrated circuit die including various exemplary layers.

Turning now to FIG. 1, a cross sectional perspective view diagram of a portion of an integrated circuit die including various exemplary layers is shown. The integrated circuit die 10 includes a semiconductor substrate 15 upon which a device layer 20 including various components and solid-state devices (not shown in FIG. 1) may be manufactured. In addition, integrated circuit die 10 includes four metal layers designated metal 1 through metal 4. The metal layers are separated by interlayer or intermetallic dielectric (LD) layers, which are designated ILD 1 through ILD 3. Lastly, a passivation layer 25 covers metal layer 4. It is noted that although in the illustrated embodiment four metal layers and three LD layers are shown, other embodiments may include any number of metal layers and any number of LD layers. Alternative embodiments are also possible that incorporate other types of layers, such as thin film device layers, for example.

In one embodiment, the integrated circuit may be a mixed signal IC that includes both analog and digital circuits. For example, in one embodiment, integrated circuit die 10 may include RF and baseband circuitry that embodies a transceiver for use in a communications devise such as a cellular phone. It is noted that in other embodiments, the integrated circuit may embody other types of circuits.

In addition, in one embodiment, the semiconductor substrate 15 may be a silicon substrate. However, in various other embodiments, the semiconductor substrate 15 may be embodied using other types of semiconducting materials such as Gallium-Arsenide (GaAs) or Silicon-Germanium (SiGe) for example.

Integrated circuit devices are formed on the surface of semiconductor substrate 15 using multiple process steps. As discussed above, the devices may be connected to one another via metal wires formed on the various metal layers. In the illustrated embodiment, the devices are interconnected by metal lines that may be fabricated on one or more of metal layers 1-4.

In some cases, devices or circuits formed in device layer 20 may be adversely effected by noise or spurious interference radiating from the wires that are proximate to the circuits. Conversely, noise may be radiated from the circuits and coupled into the wires above. As described above, using solid metal planes to reduce noise effects is typically disfavored in many IC designs due to manufacturability issues.

Figure 2:
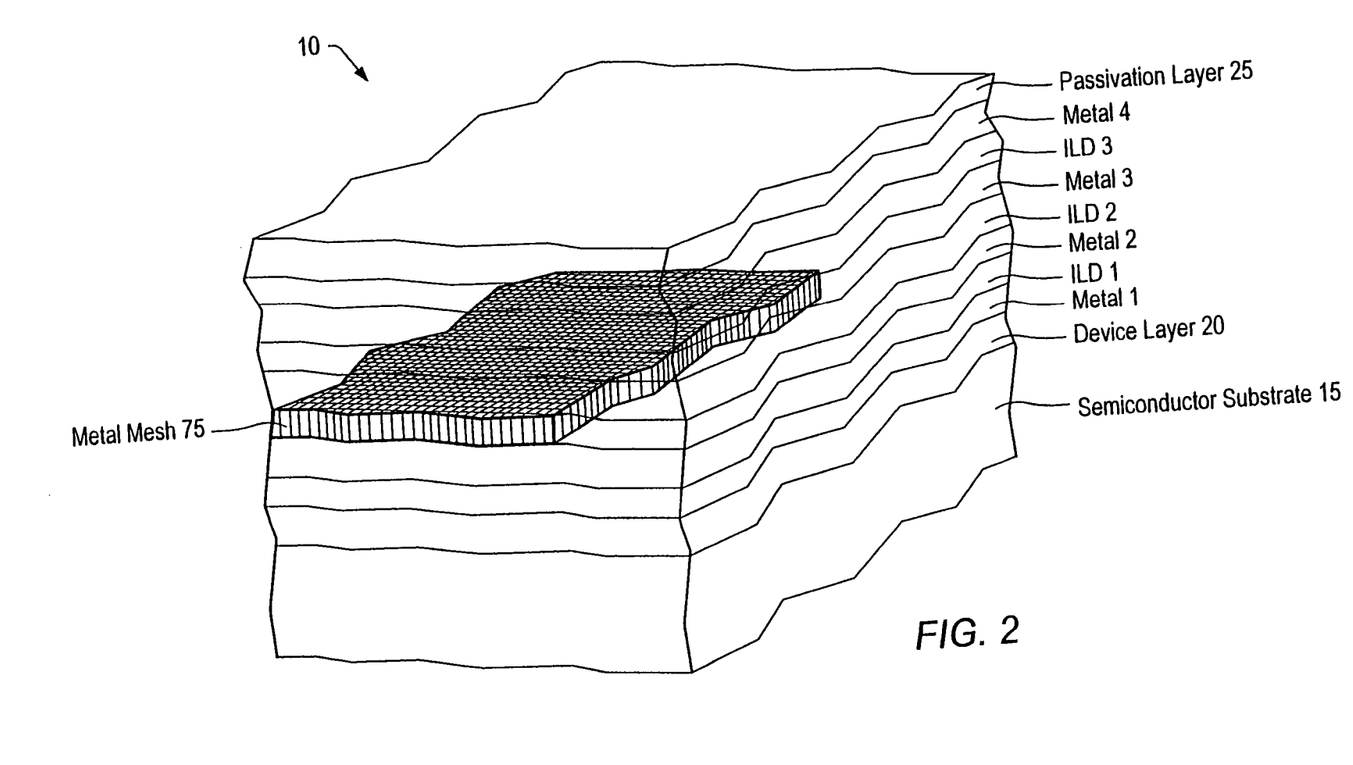
FIG. 2 is a cross sectional perspective view diagram of a portion of an integrated circuit die including a mesh shield.

Thus, as illustrated in FIG. 2, to reduce the effect of noise and/or signals generated in a given region of the IC, in one embodiment, a shield, in the form of a metal mesh 75, may be formed on a particular metal layer (e.g., metal 2) to separate the given region from an affected region.

The metal mesh 75 may be used to isolate or shield regions of the IC from one another. In the illustrated embodiment, metal mesh 75 may shield wires, nodes, or devices formed on metal layer 1 and/or device layer 20, from wires or nodes on metal layers 3 and/or 4, and vice versa. Similarly, components such as capacitors (not shown in FIG. 2) that may be formed on metal layers 3 and 4 (or in other layers above metal mesh 75) may be shielded from signals below metal layer 2.

It is noted that in the illustrated embodiment, metal mesh 75 is formed on metal layer 2. However, metal mesh 75 may be formed on any metal layer. In addition, more than one metal layer may include a metal mesh shield. Further, metal mesh 75 may be formed to cover the entire metal layer and not just a portion (as shown in FIG. 2). In some embodiments, accommodations for vias may be provided in the metal mesh 75 at desired locations.

Figure 3:
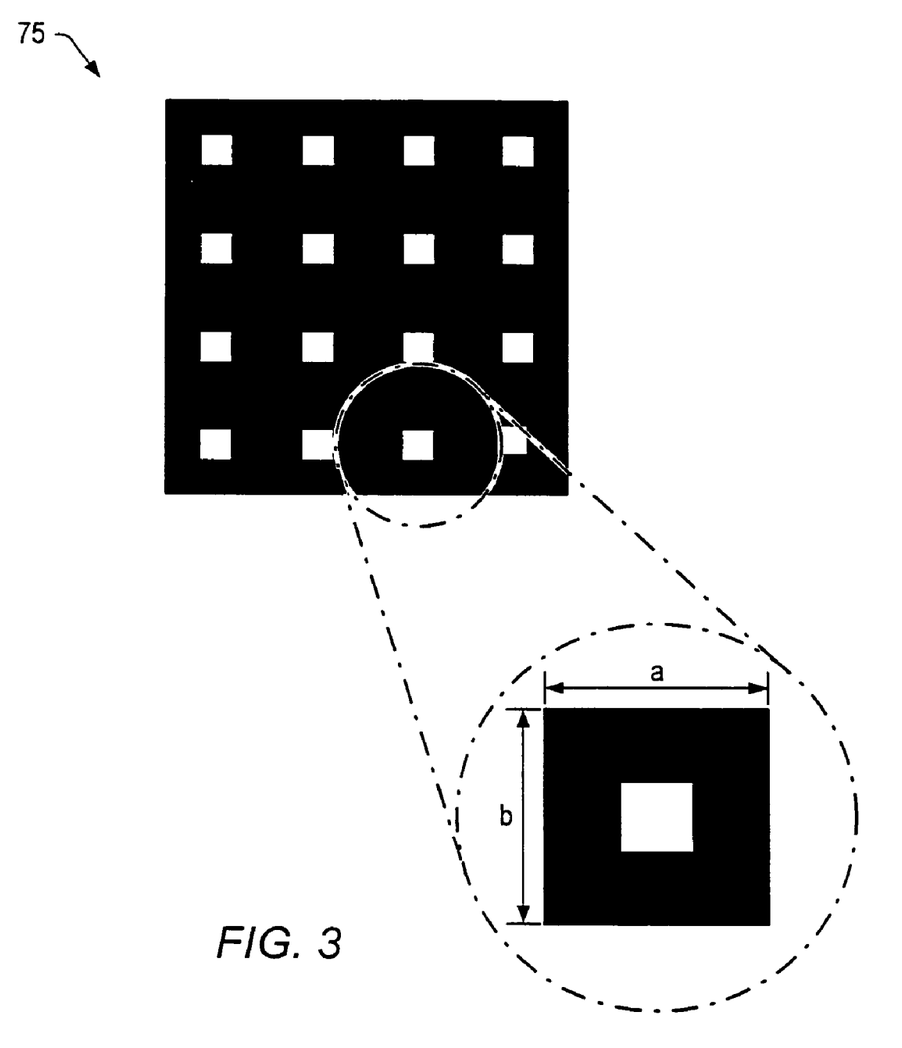
FIG. 3 is a top view diagram of one embodiment of a portion of the metal mesh shown in FIG. 2.

FIG. 3 is a top view diagram of one embodiment of a portion of the metal mesh 75. Metal mesh 75 is a structure including a number of smaller structures that are referred to as cell units. A number of cell units may be interconnected to form a mesh of any size. In the illustrated embodiment, each cell unit has substantially the same geometry, which is a rectangular shape with a rectangular hole near the center. The exploded view shows an exemplary structure of a cell unit. In this example, the geometry of the cell unit is a square (i.e., the dimension in the x and y direction is substantially equal).

The shielding characteristics provided by the metal mesh 75 may depend upon a variety of parameters including, for example, the thickness of the metal layer, the metal material being used, the geometry of the mesh, etc. For example, when modeling for capacitive shielding, consider an infinite planar structure in the xy plane, at z=0, that shields an electric field generated under it from reaching any structures above it. The electric field may be generated by another infinite planar structure in the xy plane at z<0 that is at some source potential V(x,y). Ideally, if the shielding planar structure is placed with a potential of v=0, then the potential at every point above the shielding planar structure with z>0 should be at v=0, independently of the potential V(x,y) for z<0. This would be the case if the shielding planar structure were a continuous solid ground plane.

Instead of the infinite ground plane, substitute a regular structure that may be repeated in space with a pitch (a, b) in the (x, y) directions, respectively. Decompose the space into unit cells. The field is then periodic in x, y with a repeating rate of a, b, respectively. The voltage V(x,y,z) can be decomposed into a series of the form:

$$V_{n,m}(x, y, z) = F_{n,m}(z) \cos\left(\frac{2\pi n x}{a}\right) * \cos\left(\frac{2\pi m y}{b}\right)$$

The cosine terms express the periodicity of the field and the $F_{n,m}(z)$ term expresses the rate of decay of the field for z>0. Each term needs to satisfy the equation $$\frac{\partial^2 V}{\partial x^2} + \frac{\partial^2 V}{\partial y^2} + \frac{\partial^2 V}{\partial z^2} = 0$$

Solving for the above equation, the solution becomes $$F_{n,m}(z) = A_{n,m} e^{-\frac{z}{Z_c(n,m)}}, \text{ where } Z_c(n, m) = \sqrt{\frac{1}{\left(\frac{2\pi n}{a}\right)^2 + \left(\frac{2\pi m}{b}\right)^2}}$$

$A_{n,m}$ is a function of the initial conditions of the problem, which are set by the structure of the cell unit. So the value of $F_{n,m}(z)$ may be reduced by optimizing the structure for the minimum value of $A_{n,m}$ or alternatively by making $Z_c$ as small as possible. $Z_c$ controls the rate of decay of the field for z>0. Since the first harmonic is the one that decays slowest, optimize for this condition. For n=m=1, then $$Z_c(1, 1) = \frac{1}{2\pi} \sqrt{\frac{a^2 b^2}{a^2 + b^2}}$$

For minimum $Z_c(1,1)$ use a=b and make a and b is as small as possible; therefore use the finest possible x and y grid for the regular structure. Since many IC manufacturing constraints typically dictate structures with 90-degree angles, the cell unit depicted in the exploded view is one basic structure of choice.

To model the inductive shielding parameters of metal mesh 75, consider a circular inductor shield having a radius 'R' for simplified modeling of the fields. Also at the relative frequencies, consider that the skin depth is comparable to, or larger than, the thickness of the shield. Accordingly, the magnetic field may be considered to be constant over the whole thickness. The formation of Eddy currents on the shield generates an opposing magnetic field that reduces the intensity of the incident field (normal to the plane), which provides the shielding.

There is an induced E field on the plane of the shield. In a time harmonic field, the Equation $$\nabla x E = -\mu_0 \frac{\partial H}{\partial t} \text{ becomes } \nabla x E = -\mu_0 H(j\omega).$$

The symmetry of the problem implies that E only has a θ component. Thus, $$\nabla x E = -Z\left(\frac{E_\theta}{R} + \frac{\partial E_\theta}{\partial R}\right) \text{ and } \frac{E_\theta}{R} + \frac{\partial E_\theta}{\partial R} = \mu_0 H_z(j\omega), \text{ then}$$

$$\frac{E_\theta}{R} + \frac{\partial E_\theta}{\partial R} - \mu_0 H_z(j\omega) = 0$$

For a constant $H_z$ field incident to the plane, (i.e., $H_z=H_0$) then the above equation becomes $$E_\theta(R) = \mu_0 H_0 j\omega \frac{R}{2}$$

From $E_\theta$, the current density J may be calculated from $$J = \sigma E = \sigma \mu_0 H_0 j\omega \frac{R}{2}$$

From this equation, it is shown that the better the conductivity, the better the shielding that may be achieved (since as J increases, the opposing magnetic field increases). In addition, it is also shown that the formation of the eddy currents depends on the maximum available radius of the circle. Thus, for good shielding, a conductive metal mesh structure that includes cell units where each cell unit is coupled to each other cell unit to form a mesh is desirable. As such, the eddy currents can flow in large circles with minimum restriction thereby producing the opposing magnetic field.

Accordingly, metal mesh 75 includes a number of interconnected cell units that may closely approximate a plane such that the conductivity of the metal mesh 75 permits current flow in the mesh necessary to provide sufficient capacitive shielding between two regions separated by metal mesh 75. Further, the conductivity of the metal mesh 75 permits eddy current flow in the mesh necessary to provide sufficient inductive shielding between two regions separated by metal mesh 75. Thus, with sufficient capacitive and inductive shielding between regions, devices of the integrated circuit may operate properly with minimized interference from one region to another. It is noted that in various embodiments, metal mesh structure 75 may be grounded (i.e., coupled to circuit ground) during operation.

In addition to the foregoing, many design rules require (or favor) that a particular percentage of the die area be metal. For example, many fabrication technologies desire between 20% and 80% metal fill of a metal layer. There are conventional dummy fill routines that may be used to back fill die area with metal to increase the metal coverage. However, these dummy fills are typically non-continuous and non-uniform and may introduce unintended electrical side-effects.

From a topological perspective, the metal mesh 75 not only provides shielding between regions of an integrated circuit, but may also (or alternatively) provide desired metal density using a regular metal structure while having uniformity over the complete area through which it extends. Thus, instead of using conventional dummy metal fill routines to satisfy manufacturability rules, metal mesh 75 may be used to establish a desired percentage of metal density in a given region of a metal layer.

Figure 4A:
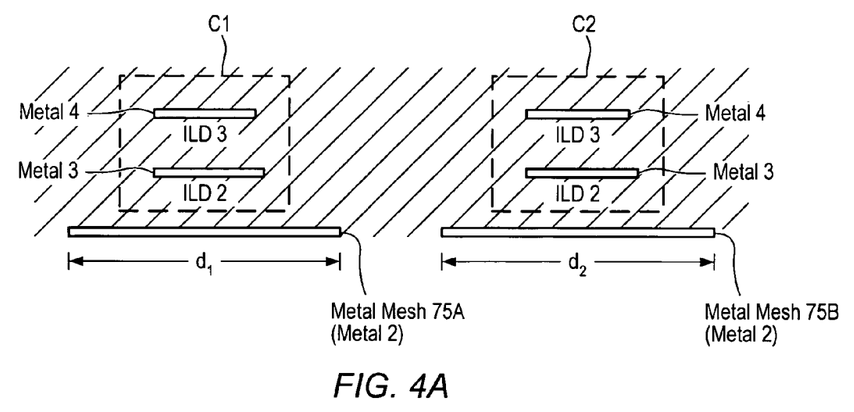
FIG. 4A is a cross sectional view diagram of a pair of matched metal-insulator-metal capacitors including a pair of metal meshes in one embodiment.
Figure 4B:
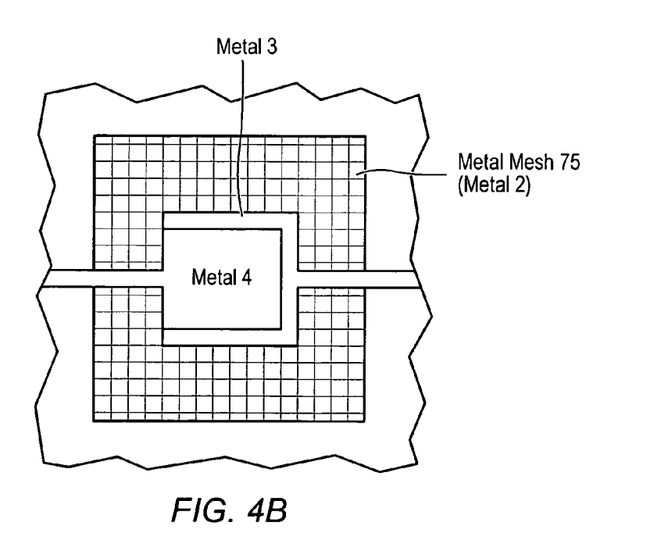
FIG. 4B is a top view diagram of each of the metal-insulator-metal capacitors of FIG. 4A.

FIG. 4A and FIG. 4B illustrate a particular use of a pair of metal mesh structures as described above positioned in association with a pair of capacitors within integrated circuit die 10. More particularly, in FIG. 4A, a cross section of a pair of metal-insulator-metal (MIM) capacitors C1 and C2 and metal meshes 75A and 75B is shown. FIG. 4B illustrates a top view of each of the metal-insulator-metal capacitors of FIG. 4A.

Referring collectively to FIG. 4A and FIG. 4B, each of MIM capacitor C1 and C2 includes a first metal plate and a second metal plate separated by a dielectric. The first metal plate is shown to be formed on the metal layer 4 and the second metal plate is formed on metal layer 3. Likewise, the dielectric between the two plates is formed within ILD 3. In addition, a metal mesh 75A and a metal mesh 75B are formed on metal layer 2, which is below MIN capacitor C1 and MIN capacitor C2, respectively. It is noted that in other embodiments, the MIM capacitors and metal mesh 75A-B may be formed on any of the metal layers.

In some implementations, it may be desirable to match the capacitance of MIN capacitors C1 and C2. As described above, metal meshes 75A and 75B may provide shielding between capacitors C1 and C2 and any devices and/or wires below them. More particularly, in one embodiment, the length '$d_1$' of metal mesh 75A of capacitor C1 is substantially the same as the length '$d_2$' of metal mesh 75B of capacitor C2. Due to the shielding properties of metal mesh 75A and metal mesh 75B, the environments of capacitors C1 and C2 may be made substantially equal. Accordingly, the capacitances of capacitors C1 and C2 may be more precisely matched. In addition, in some process technologies, the possibility of dishing of the metal meshes may be less likely in comparison to solid metal planes.

In alternative embodiments, it is noted that metal meshes 75A and 75B may be replaced with a single metal mesh (not shown). In such alternative embodiments, the single metal mesh may shield both C1 and C2 such that the environments of capacitors C1 and C2 may be made substantially equal.

Figure 5:
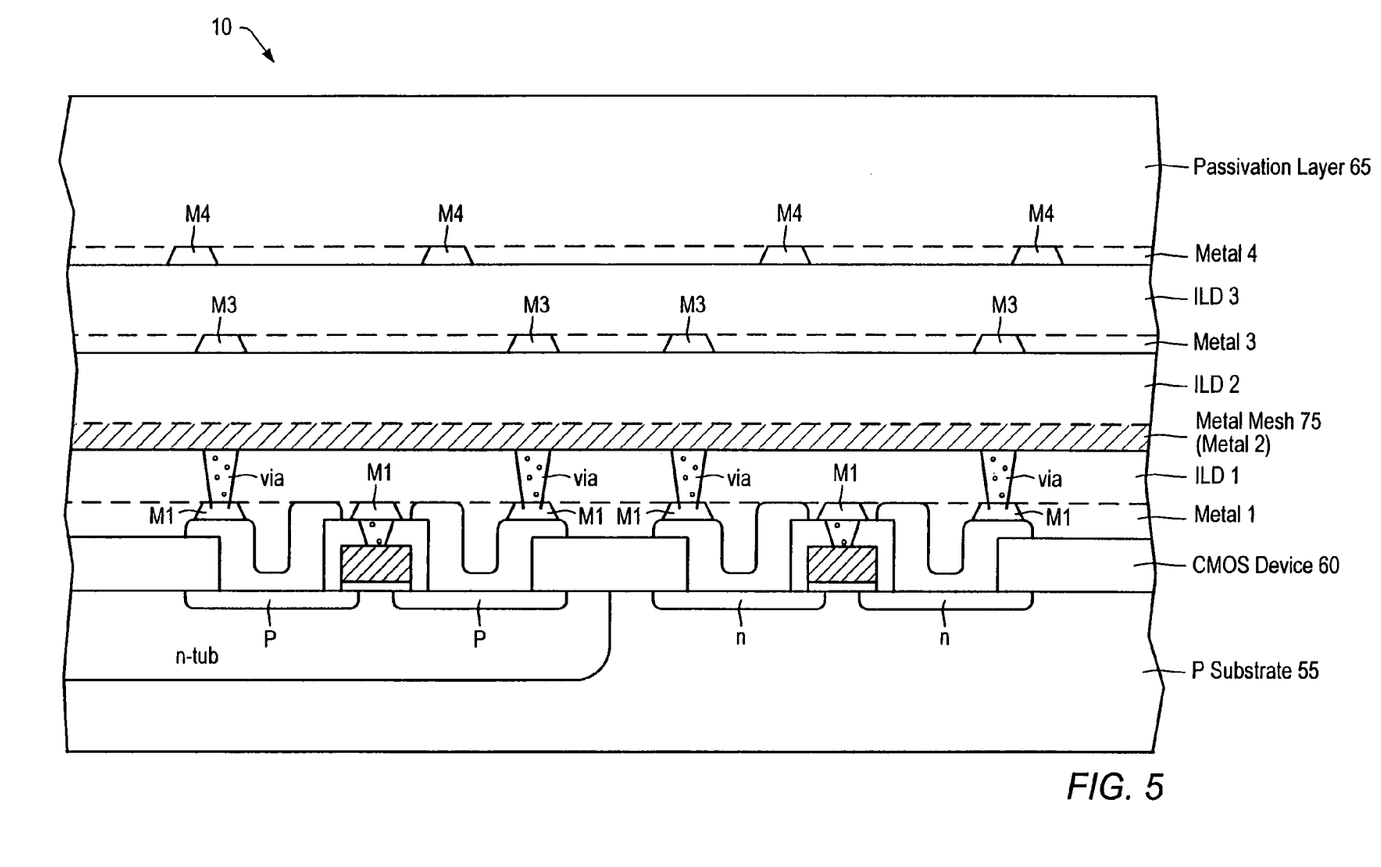
FIG. 5 is a cross sectional view diagram illustrating further details of another embodiment of the integrated circuit die of FIG. 2.

FIG. 5 is a cross sectional view diagram illustrating details of another embodiment of integrated circuit die 10 in which a metal mesh shield is employed. More particularly, as shown in FIG. 5, integrated circuit die 10 may include a complimentary metal oxide semiconductor (CMOS) device 60 formed upon the semiconductor substrate 15. Various wires designated M1 have been formed on the metal 1 layer to connect parts of CMOS device 60. A metal mesh 75 is shown on metal layer 2. In addition, integrated circuit die 10 includes metal layers 3 and 4 each including metal wires designated M3 and M4, respectively. ILD layer 2 separates metal layers 2 and 3, while ILD layer 3 separates metal layers 3 and 4. A passivation layer 25 covers metal layer 4.

As described above, the metal mesh 75 may provide shielding (capacitive and/or inductive) between the regions of the integrated circuit that are separated by metal mesh 75. For example, the wires M3 may be shielded from any signals that may radiate from either CMOS device 60 or wires M1. Likewise, CMOS device 60 may be shielded from any signals that may radiate from wires M3 or M4. Similar shielding may be provided between regions including other devices, as desired.

It is noted that numerous alternative metal mesh structures having similar characteristics may be employed in alternative embodiments. In general, any structure formed by a connected and closed set of metal units of the same or different sizes, that is relatively uniform over the complete space and maintains approximately the same density over the complete space, and where all holes (or openings) in the set are relatively small (for example, where the holes are close to the minimum allowed by the technology) may be utilized. For example, depending upon the desired electrical characteristics, metal density, and/or other factors, the geometry of each cell unit opening as well as the cell unit pitch may be varied. FIGS. 6A-6D illustrate several such alternative embodiments of metal mesh structures that may be used in the place of metal mesh 75.

Figure 6A:
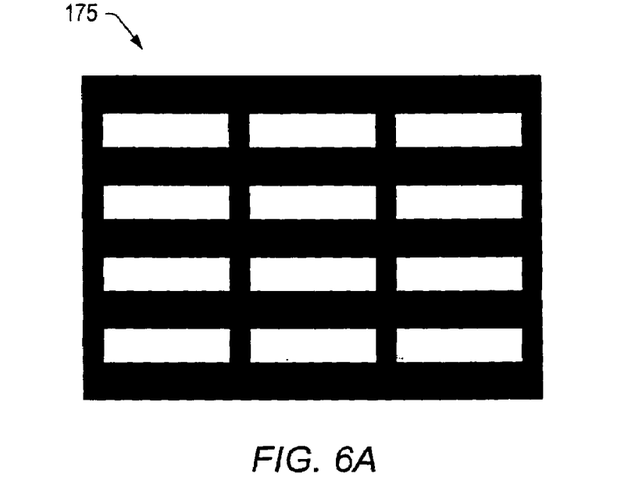
FIG. 6A is a diagram of an alternative embodiment of a mesh structure.

In FIG. 6A, metal mesh 175 includes a number of cell units each having substantially the same rectangular geometry as that of FIG. 3. However, in contrast to the cell units of FIG. 3, the cell units of FIG. 6A have a hole that is longer in the x (a) direction than in the y (b) direction. In addition, the pitch is different in the x (a) direction than in the y (b) direction.

Figure 6B:
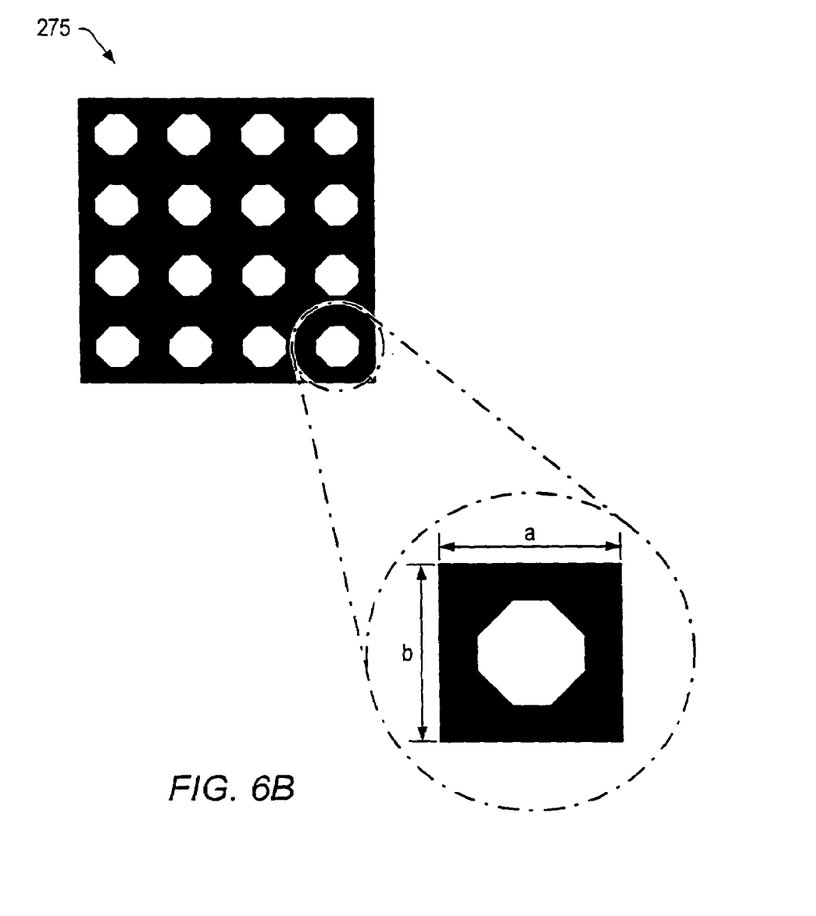
FIG. 6B is a diagram of another alternative embodiment of a mesh structure.

In FIG. 6B, metal mesh 275 also includes a number of cell units each having substantially the same rectangular geometry that are interconnected to form the mesh. However, the hole geometry of the metal mesh 275 is a six-sided polygon (e.g., hexagonal).

Figure 6C:
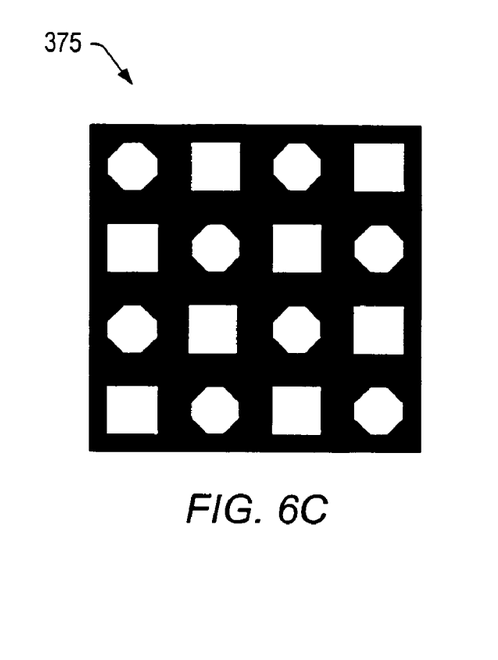
FIG. 6C is a diagram of a further alternative embodiment of a mesh structure.

In FIG. 6C, metal mesh 375 includes a number of cell units interconnected to form a mesh. However, the geometry of the holes formed within metal mesh 375 are not geometrically consistent (e.g., some holes are rectangular while others are hexagonal.)

Figure 6D:
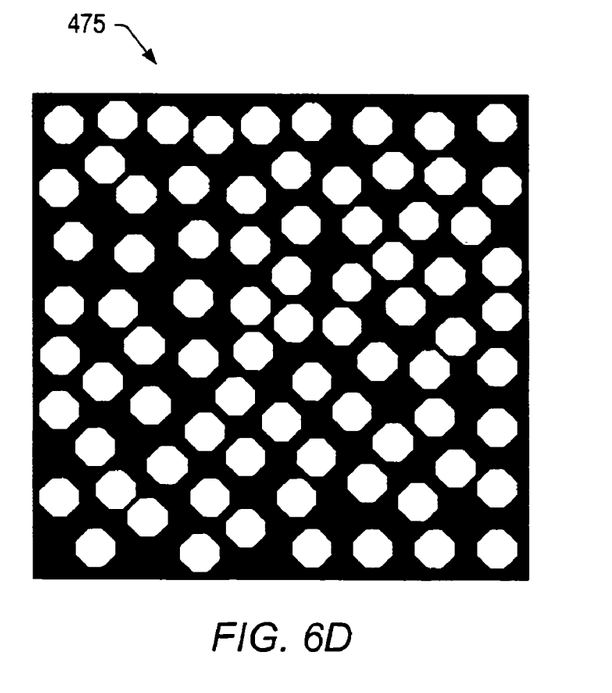
FIG. 6D is a diagram of yet another alternative embodiment of a mesh structure.

In FIG. 6D, metal mesh 475 includes a number of cell units which have somewhat varying pitches (within an acceptable tolerance). As a result, the spacing of openings within the mesh across its space is not entirely uniform.

The metal meshes FIGS. 6A-6D may exploit concepts similar to the concepts discussed above in conjunction with the description of FIG. 3 and may thereby provide capacitive shielding, inductive shielding, and/or desired metal density.

It is noted that numerous other specific mesh topologies (e.g., dimensions, shapes) may be employed in further alternative embodiments. For example, in other alternative embodiments, the hole geometry of the mesh could be in the form of a circle, in the form of an oval, or in an irregular form. Likewise, the percentage of metal across the mesh space (i.e., the ratio of metal space to open space) may differ from that of the above depicted embodiments.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor integrated circuit die incorporating a plurality of devices, the semiconductor integrated circuit die comprising:
    a first region;
    a second region; and
    a plurality of metal layers each providing interconnects for the devices in the first region below the second region, at least a first of the metal layers interposed between the first and second regions and including at least one interconnected metal mesh region formed by a plurality of openings, the at least one interconnected metal mesh region providing shielding between the first and second regions, wherein the at least one metal mesh layer is arranged above the devices.

2. The semiconductor integrated circuit die as recited in claim 1, wherein the first region includes a device layer having one or more active semiconductor devices.

3. The semiconductor integrated circuit die as recited in claim 2, wherein the second region includes a metallization layer including circuit wires.

4. The semiconductor integrated circuit die as recited in claim 1, wherein conductivity of the metal mesh provides sufficient capacitive shielding between the first and second regions to attain proper operation of the semiconductor integrated circuit die.

5. The semiconductor integrated circuit die as recited in claim 1, wherein conductivity of the metal mesh provides sufficient inductive shielding between the first and second regions to attain proper operation of the semiconductor integrated circuit die.

6. The semiconductor integrated circuit die as recited in claim 1, wherein the metal mesh is formed by metal wires, wherein the metal wires include a first set of substantially parallel wires oriented in a first direction and a second set of substantially parallel wires oriented in a second direction, wherein each wire of the first set of wires intersects and electrically connects each wire of the second set of wires, and wherein the second direction is substantially perpendicular to the first direction.

7. The semiconductor integrated circuit die as recited in claim 6, wherein the metal mesh has a smaller pitch in the first direction than in the second direction.

8. The semiconductor integrated circuit die as recited in claim 6, wherein the metal wires are substantially uniformly spaced in the first direction and in the second direction.

9. The semiconductor integrated circuit die as recited in claim 1, wherein the second region includes a first capacitor having a first pair of conductive plates separated by an interlayer dielectric material.

10. The semiconductor integrated circuit die as recited in claim 9, wherein the second region further includes a second capacitor having a second pair of conductive plates separated by said interlayer dielectric material.

11. The semiconductor integrated circuit die as recited in claim 10, wherein the first and second capacitors are substantially equivalently structured to provide matched capacitance values.

12. The semiconductor integrated circuit die as recited in claim 1, wherein the first region includes analog and digital circuits embodying a mixed signal circuit.

13. The semiconductor integrated circuit die as recited in claim 1, wherein the first metal layer includes at least two separate interconnected metal mesh regions.

14. The semiconductor integrated circuit die as recited in claim 1, wherein a second of the plurality of metal layers includes a further metal mesh region.

15. A semiconductor integrated circuit die incorporating a plurality of devices, the semiconductor integrated circuit die comprising:
   a first region;
   a second region; and
   a plurality of metal layers each providing interconnects for the devices in the first region below the second region, at least a first of the metals layers incorporating a shield situated between the first region and the second region, wherein the shield is formed by the metallic layer including an interconnected pattern of substantially uniformly space openings, wherein the shield is arranged above the devices.

16. The semiconductor integrated circuit die as recited in claim 15, wherein the first region includes a device layer having one or more active semiconductor devices.

17. The semiconductor integrated circuit die as recited in claim 16, wherein the second region includes a second metallic layer including circuit wires.

18. The semiconductor integrated circuit die as recited in claim 15, wherein the shield conductivity provides sufficient captive shielding between the first and second regions to attain proper operation of the semiconductor integrated circuit die.

19. The semiconductor integrated circuit die as recited in claim 15, wherein the shield conductivity provides sufficient inductive shielding between the first and second regions to attain proper operation of the semiconductor integrated circuit die.

20. The semiconductor integrated circuit die as recited in claim 15, wherein the second region includes a first capacitor having a first pair of conductive plates separated by an interlayer dielectric material.

21. The semiconductor integrated circuit die as recited in claim 20, wherein the second region further includes a second capacitor having a second pair of conductive plates separated by said interlayer dielectric material.

22. The semiconductor integrated circuit die as recited in claim 21, wherein the first and second capacitors are substantially equivalently structured to provide matched capacitance values.

23. An integrated circuit die incorporating a plurality of devices, the integrated circuit die comprising:
   a first signal node;
   a second signal node; and
   a plurality of metal layers each providing interconnects for the devices in the second signal node, at least one of the metal layers incorporating an interconnected metallic mesh structure formed between the first and second signal nodes and above the devices.

24. The integrated circuit die as recited in claim 23, wherein the conductivity of the metallic mesh structure provides sufficient capacitive shielding between the first node and the second node to attain proper operation of the integrated circuit die.

25. The integrated circuit die as recited in claim 23, wherein conductivity of the metallic mesh structure provides sufficient inductive shielding between the first node and the second node to attain proper operation of the integrated circuit die.

26. A method comprising:
   providing a first region of a semiconductor integrated circuit die;
   providing a second region of the semiconductor integrated circuit die;
   providing a plurality of metal layers each providing interconnects for devices in the first region below the second region incorporated into the semiconductor integrated circuit die at least a first one of the metal layers being interposed between the first and second regions; and
   incorporating an interconnected metal mesh in the first metal layer between the first and second regions, wherein the metal mesh is arranged above the devices.

27. The method as recited in claim 26, wherein the first region includes a device layer having one or more active semiconductor devices.

28. The method as recited in claim 26, wherein the second region includes a metallization layer including circuit wires.

29. The method as recited in claim 26, wherein conductivity of the layer of metal mesh provides sufficient capacitive shielding between the first and second regions to attain proper operation of the semiconductor integrated circuit die.

30. The method as recited in claim 26, wherein conductivity of the layer of metal mesh provides sufficient inductive shielding between the first and second regions to attain proper operation of the semiconductor integrated circuit die.

31. The method of claim 26, wherein incorporating the metal mesh in the first metal layer comprises forming a plurality of openings in the first metal layer.

32. The method of claim 31, wherein forming the plurality of openings comprises etching the first metal layer.

* * * * *